(12) United States Patent
Rahman et al.

(10) Patent No.: US 8,906,592 B2
(45) Date of Patent: Dec. 9, 2014

(54) ANTIREFLECTIVE COATING COMPOSITION AND PROCESS THEREOF

(75) Inventors: M. Dalil Rahman, Flemington, NJ (US); Clement Anyadiegwu, Parlin, NJ (US); Douglas McKenzie, Easton, PA (US); JoonYeon Cho, Bridgewater, NJ (US)

(73) Assignee: AZ Electronic Materials (Luxembourg) S.A.R.L., Luxembourg (LU)

( * ) Notice: Subject to any disclaimer, the term of this patent is extended or adjusted under 35 U.S.C. 154(b) by 255 days.

(21) Appl. No.: 13/563,877

(22) Filed: Aug. 1, 2012

(65) Prior Publication Data
US 2014/0038109 A1    Feb. 6, 2014

(51) Int. Cl.
  *G03F 7/11*  (2006.01)
  *G03F 7/30*  (2006.01)
  *G03F 7/09*  (2006.01)

(52) U.S. Cl.
  CPC ........ *G03F 7/091* (2013.01); *C08G 2261/1422* (2013.01)
  USPC ...................... 430/271.1; 430/272.1; 430/311; 430/325; 430/319; 528/153; 525/480; 525/534; 525/502

(58) Field of Classification Search
  CPC .............................................. C08G 2261/1422
  See application file for complete search history.

(56) References Cited

U.S. PATENT DOCUMENTS

| | | |
|---|---|---|
| 3,474,054 A | 10/1969 | White |
| 4,200,729 A | 4/1980 | Calbo |

(Continued)

FOREIGN PATENT DOCUMENTS

| | | |
|---|---|---|
| EP | 1 995 636 A1 | 11/2008 |
| JP | 8-301980 A | 11/1996 |

(Continued)

OTHER PUBLICATIONS

English Language Abstract from Espacenet of KR 10-2010-0072660 A.

(Continued)

*Primary Examiner* — Cynthia Hamilton
(74) *Attorney, Agent, or Firm* — Sangya Jain

(57) ABSTRACT

The invention relates to an antireflective coating composition comprising a crosslinkable polymer, where the crosslinkable polymer comprises at least one unit of fused aromatic moiety, at least one unit with a phenylene moiety in the backbone of the polymer, and at least one hydroxybiphenyl unit, furthermore where the polymer comprises a crosslinking moiety of structure (4),

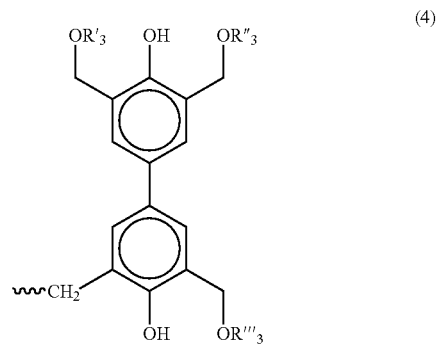

where $R'_3$, $R''_3$ and $R'''_3$ are independently hydrogen or a $C_1$-$C_4$alkyl. The invention further relates to a process for forming an image using the composition.

14 Claims, 1 Drawing Sheet

(56) References Cited

U.S. PATENT DOCUMENTS

| | | |
|---|---|---|
| 4,251,665 A | 2/1981 | Calbo |
| 4,491,628 A | 1/1985 | Ito et al. |
| 5,187,019 A | 2/1993 | Calbo et al. |
| 5,350,660 A | 9/1994 | Urano et al. |
| 5,629,355 A | 5/1997 | Kuczynski |
| 5,843,624 A | 12/1998 | Houlihan et al. |
| 6,268,072 B1 | 7/2001 | Zheng et al. |
| 6,447,980 B1 | 9/2002 | Rahman et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,916,590 B2 | 7/2005 | Kaneko et al. |
| 7,060,410 B2 | 6/2006 | Ohnishi et al. |
| 7,405,029 B2 | 7/2008 | Oh et al. |
| 7,632,622 B2 | 12/2009 | Uh et al. |
| 7,691,556 B2 | 4/2010 | Wu et al. |
| 7,754,414 B2 | 7/2010 | Oberlander |
| 7,932,018 B2 | 4/2011 | McKenzie et al. |
| 7,989,144 B2 | 8/2011 | Rahman et al. |
| 8,017,296 B2 | 9/2011 | Houlihan et al. |
| 8,445,187 B2 | 5/2013 | Yoon et al. |
| 8,465,902 B2 | 6/2013 | Yao et al. |
| 8,486,609 B2 | 7/2013 | Rahman et al. |
| 2004/0181909 A1 | 9/2004 | Kawamoto |
| 2005/0058929 A1 | 3/2005 | Kennedy et al. |
| 2006/0234158 A1 | 10/2006 | Hatakeyama |
| 2006/0251990 A1 | 11/2006 | Uh et al. |
| 2007/0059635 A1 | 3/2007 | Oh et al. |
| 2007/0148586 A1 | 6/2007 | Uh et al. |
| 2008/0005441 A1 | 1/2008 | Droux et al. |
| 2008/0153033 A1 | 6/2008 | Hyun et al. |
| 2008/0160460 A1 | 7/2008 | Yoon et al. |
| 2008/0160461 A1 | 7/2008 | Yoon et al. |
| 2008/0292987 A1 | 11/2008 | Houlihan et al. |
| 2009/0176165 A1 | 7/2009 | Cheon et al. |
| 2010/0021830 A1 | 1/2010 | Kim et al. |
| 2010/0119979 A1 | 5/2010 | Rahman et al. |
| 2010/0119980 A1 | 5/2010 | Rahman et al. |
| 2010/0151392 A1 | 6/2010 | Rahman et al. |
| 2010/0316949 A1 | 12/2010 | Rahman et al. |
| 2010/0316950 A1 | 12/2010 | Oguro et al. |
| 2011/0151376 A1 | 6/2011 | Rahman et al. |
| 2011/0178252 A1 | 7/2011 | Sung et al. |
| 2012/0153424 A1 | 6/2012 | Oh et al. |
| 2012/0168894 A1 | 7/2012 | Kim et al. |
| 2012/0181251 A1* | 7/2012 | Minegishi et al. .............. 216/49 |
| 2012/0251943 A1 | 10/2012 | Rahman et al. |
| 2012/0251956 A1 | 10/2012 | Rahman et al. |
| 2012/0252218 A1 | 10/2012 | Kori et al. |
| 2012/0326140 A1 | 12/2012 | Fukushima et al. |
| 2013/0158165 A1 | 6/2013 | Han et al. |

FOREIGN PATENT DOCUMENTS

| | | |
|---|---|---|
| JP | 2005-19055 A | 1/2005 |
| JP | 2009-14816 A | 1/2009 |
| JP | 2010-271654 A | 12/2010 |
| JP | 2012-207007 A | 10/2012 |
| KR | 10-2010-0072660 A | 7/2010 |

OTHER PUBLICATIONS

Form PCT/ISA/220, Form PCT/ISA/210, and Form PCT/ISA/237 for PCT/IB2012/000632 dated Jun. 19, 2012, which corresponds to U.S. Appl. No. 13/351,681.

Office Action mail date May 9, 2014 for U.S. Appl. No. 13/351,681.

Form PCT/IB/326, Form PCT/IB/373, and Form PCT/ISA/237 dated Oct. 10, 2013 for PCT/IB2012/000632, which corresponds to U.S. Appl. No. 13/075,749.

Office Action mail date Jul. 5, 2013 for U.S. Appl. No. 13/351,681.

Office Action mail date Aug. 27, 2013 for U.S. Appl. No. 13/351,681.

Advisory Action Before the Filing of an Appeal notification date Apr. 15, 2014 for U.S. Appl. No. 13/351,681.

Final Office Action mail date Jan. 9, 2014 for U.S. Appl. No. 13/351,681.

Notice of Allowance notification date Aug. 20, 2014 for U.S. Appl. No. 13/351,681.

* cited by examiner

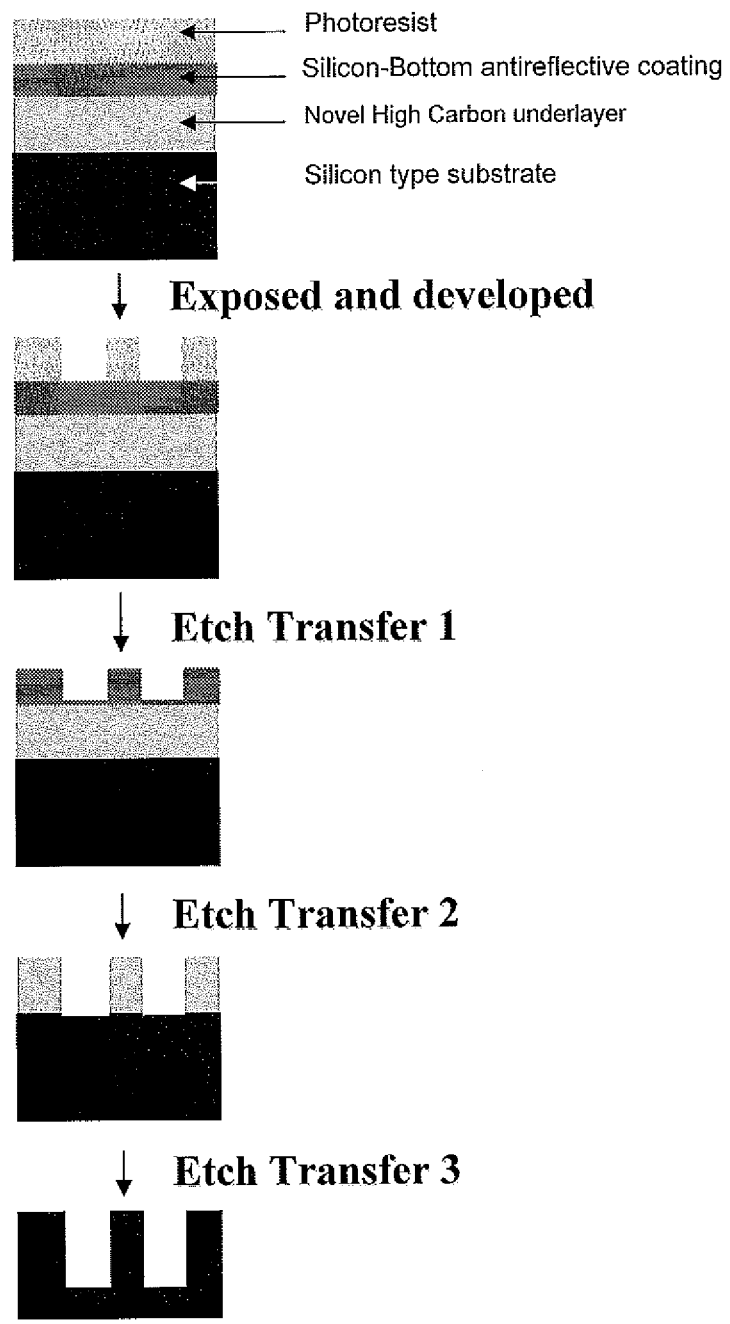
Imaging Process of a Trilayer

ANTIREFLECTIVE COATING COMPOSITION AND PROCESS THEREOF

The present invention relates to an antireflective coating composition comprising a crosslinkable polymer, and a process for forming an image using the antireflective coating composition. The process is especially useful for imaging photoresists using radiation in the deep and extreme ultraviolet (uv) region.

Photoresist compositions are used in microlithography processes for making miniaturized electronic components such as in the fabrication of computer chips and integrated circuits.

Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing an organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist.

The present invention relates to a novel organic spin coatable antireflective coating composition or organic mask underlayer which has high carbon content, and can be used between a photoresist layer and the substrate as a single layer and part of one of multiple layers. Typically, the novel composition can be used to form a layer beneath an essentially etch resistant antireflective coating layer, such as a silicon antireflective coating. The high carbon content in the novel antireflective coating, also known as a carbon hard mask underlayer, allows for a high resolution image transfer with high aspect ratio. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

SUMMARY OF THE INVENTION

The invention relates to an antireflective coating composition comprising a crosslinkable polymer, where the crosslinkable polymer comprises at least one unit of fused aromatic moiety, at least one unit with a phenylene moiety in the backbone of the polymer, and at least one hydroxybiphenyl unit, furthermore where the polymer comprises a crosslinking moiety of structure (4),

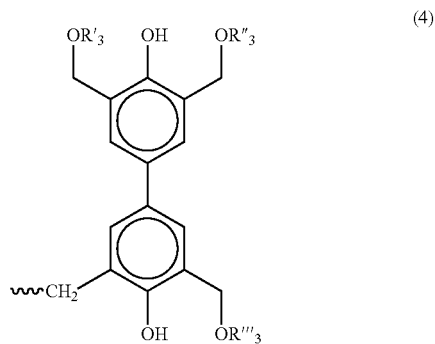

where $R'_3$, $R''_3$ and $R'''_3$ are independently hydrogen or a $C_1$-$C_4$ alkyl. The invention further relates to a process for forming an image using the composition.

BRIEF DESCRIPTION OF DRAWINGS

FIG. 1 illustrates a process of imaging.

DETAILED DESCRIPTION OF THE INVENTION

The present invention relates to an absorbing antireflective coating composition comprising a crosslinkable polymer capable of being crosslinked, where the polymer comprises at least one unit with a phenylene group in the backbone of the polymer, at least one fused aromatic unit in the backbone of the polymer, and at least one hydroxybiphenyl unit, and where the polymer further comprises a crosslinking moiety of structure (4). The polymer is a self-crosslinkable polymer. The invention also relates to a process for imaging a photoresist layer coated above the novel antireflective coating layer.

The novel antireflective composition of the present invention comprises a novel polymer with high carbon content which is capable of crosslinking, such that the coating, formed from the composition after crosslinking, becomes insoluble in the solvent of the material coated above it. The novel coating composition is capable of self-crosslinking or may additionally comprise a crosslinking compound capable of crosslinking with the polymer. The composition may additionally comprise other additives, such as organic acids, esters, thermal acid generators, photoacid generators, surfactants, other high carbon content polymers etc. The composition may comprise additional polymers, especially those with high carbon content. The solid components of the novel composition are dissolved in an organic coating solvent composition, comprising one or more organic solvents. The novel polymer is soluble in the organic coating solvent(s).

The polymer of the novel composition comprises at least one unit of fused aromatic moiety, at least one unit with a phenylene moiety in the backbone of the polymer, and at least one hydroxybiphenyl unit, where the polymer further comprises a crosslinking moiety of structure (4),

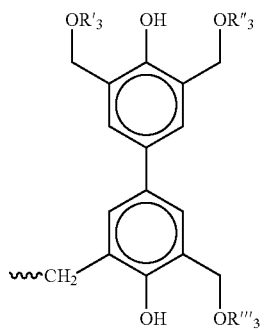
(4)

where $R'_3$, $R''_3$ and $R'''_3$ are independently hydrogen or a $C_1$-$C_4$alkyl.

The crosslinkable polymer can be represented by structure (1), where the polymer comprises at least one unit A (1'), at least one unit B (1'') and at least one unit C (1''') are present:

(1)

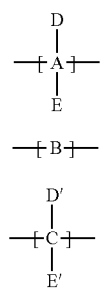

where A is a group containing a fused aromatic ring, B has a structure (2), and C is a hydroxybiphenyl of structure (3),

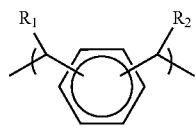
(2)

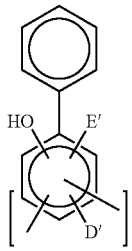
(3)

where $R_1$ is H or $C_1$-$C_4$alkyl, $R_2$ is H or $C_1$-$C_4$alkyl, D and D' are independently selected from a group consisting of hydrogen, hydroxyl and $C_1$-$C_4$alkyl, E and E' are independently hydrogen or a group of structure 4, and where the polymer further comprises a crosslinking moiety of structure (4). Structure 4 is a moiety derived from an oxymethylated biphenylphenol in which $R'_3$, $R''_3$ and $R'''_3$ are independently hydrogen or a $C_1$-$C_4$alkyl, and structure 4 is present in the polymer either as E, or E'' or attached to an additional repeating unit within the polymer.

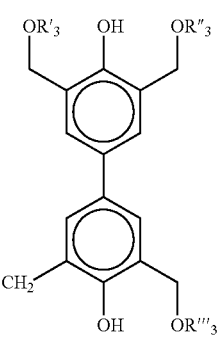
(4)

The repeat unit (1') containing a fused aromatic repeat moiety may be represented by structure (5) or (6), where D and E are substituents as previously described.

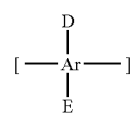
(5)

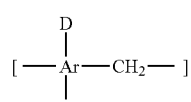
(6)

The fused aromatic moiety comprises 2 or more aromatic units fused together to form a multicyclic fused aromatic moiety. The fused aromatic moiety may comprise 2-8 aromatic rings or 2-6 aromatic rings or 3-5 aromatic rings or 3-4 aromatic rings. The fused aromatic moiety may comprise 3 aromatic rings. The fused aromatic moiety may be anthracyl. Since the polymer is formed by polymerization in which a carbocation attacks an electronic rich fused aromatic moiety or a phenolic moiety, the sequence of repeat units will be determined by this reactive tendency. Similarly, as the substitution of pendant groups having structure (4) on the polymer is also a reaction of a carbocation with an electron rich group, these substituents will probably attach to either a fused aromatic moiety in repeat unit comprising A or a phenolic ring in repeat unit comprising C or to an additional repeating unit. As a non limiting example, when repeat unit comprising A has structure (5), a polymer will form in which the repeat units comprising A and C are adjacent to a unit comprising B as shown in the non limiting example structure (7), where D, D', E and E' are as previously defined. Additionally, it is envisaged that branched structures are also possible in which more than 2 other units are attached to a given repeat unit.

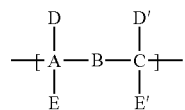
(7)

In the embodiment, where the repeat unit comprising A has structure (6) the repeat unit comprising A may be adjacent to another unit comprising A, B or C. Additionally, branched structures are also possible in which more than 2 other units are attached to a given repeat unit.

The moiety of structure (4) may be present in at least one of repeating unit comprising A, C or F (described below). In one embodiment of polymeric structure (1) at least one of E or E' is moiety of structure (4). In another embodiment of the polymer at least one of E or E' or E" is a moiety of structure (4).

In one embodiment the polymer may further comprise an optional repeat unit comprising F. Structure (8) is one representation of unit F and may be represented by a fused aromatic repeat unit of structure (9) attached only through its aromatic moiety to other repeat units in the backbone of the polymer, where D" is independently a substituent chosen from the group consisting of hydrogen, hydroxyl, $C_1$-$C_4$ alkyl, substituted alkyl, aryl, substituted aryl, alkylaryl, haloalkyls, amino, aminoalkyl and alkoxy, such as methyl, aminomethyl, bromomethy, and E" is independently hydrogen or a substituent containing a crosslinking group of structure 4 as previously described.

(8)

(9)

Ar' may comprise 2-8 fused aromatic rings.

Specific, non limiting examples of structure 8 are as follows:

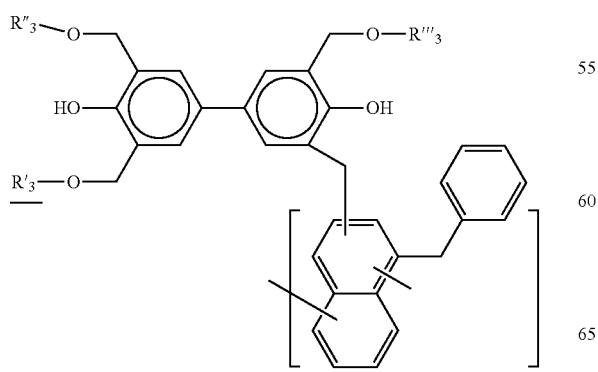

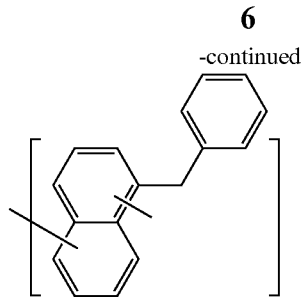

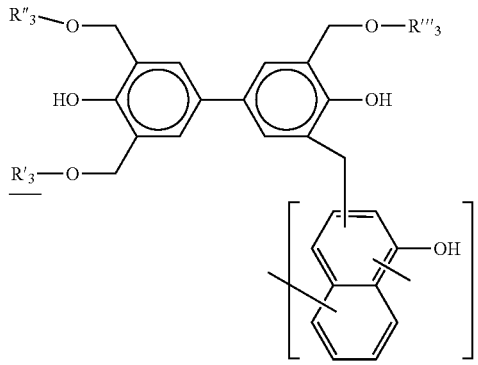

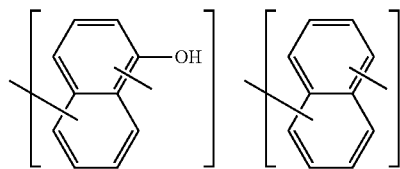

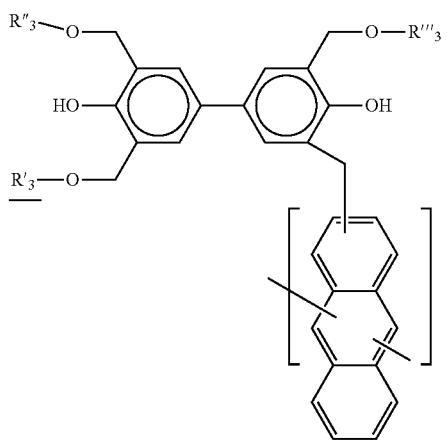

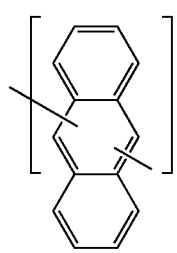

-continued

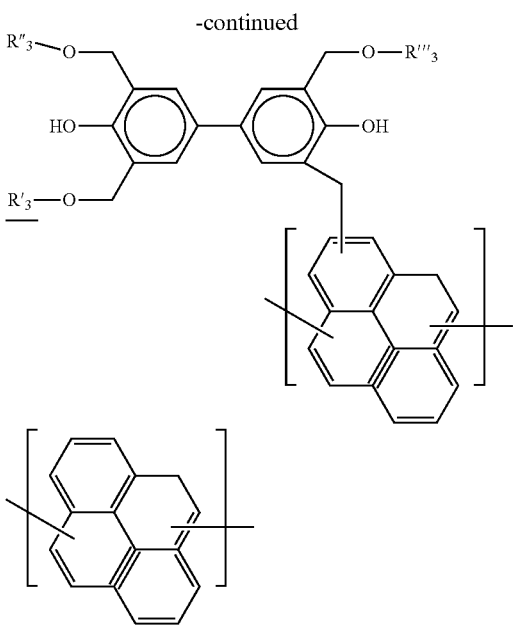

The novel polymer may be obtained by a condensation reaction of a monomer (I) comprising either a fused aromatic group or a fused aromatic ring with a reactive methylene group (which has a moiety susceptible to undergo electrophilic reaction e.g. —CH$_2$—OH, —CH$_2$—OCH$_3$, —CH$_2$—Cl and the like), a monomer (II) comprising a phenylene moiety with 2 attached vinyl groups or with two reactive methylene groups (which have a moiety susceptible to undergo electrophilic reaction e.g. —CH$_2$—OH, —CH$_2$—OCH$_3$, —CH$_2$—Cl and the like) and a monomer (III) with a hydroxybiphenyl moiety, reacted in the presence of an acid catalyst to form a polymer on which is subsequently attached while heating either a [1,1'-biphenyl]-4,4-diol, 3,3',5,5'-tetrakis(alkoxymethyl) (IV) or [1,1'-biphenyl]-4,4-diol, 3,3',5,5'-tetrakis(hydroxymethyl) (V) compound. The initial reaction mixture prior to the attachment of the pendant group of structure (4) may further comprise a fused aromatic compound (VI). This fused aromatic compound may also be subsequently substituted by either a [1,1'-biphenyl]-4,4-diol, 3,3',5,5'-tetrakis(alkoxymethyl) (IV) or [1,1'-biphenyl]-4,4-diol, 3,3',5,5'-tetrakis(hydroxymethyl) (V) compound to form a substituent having structure 4 attached to the repeat unit.

As an example, the monomer (II) may be divinylbenzene; the compound (I) may be anthracene methanol such as 9-anthracene methanol; the compound (III) may be 2-phenylphenol; and, the compound (VI) may be naphthalene, anthracene or pyrene. The compound (I) may also be derived from ArCH$_2$X, where Ar is the fused aromatic moiety, and X is a leaving group, such as OH, Cl, I, Br, carboxylate, sulfonate, etc; examples of compound (I) are anthracenemethanol, phenanthrenemethanol, pyrenemethanol, fluoranthenemethanol, coronenemethanol, triphenylenemethanol, anthracene-9-methanol, anthracene methylmethoxy, etc. The fused aromatic rings provide reactive sites which are sites for electrophilic substitution. The biphenyl unit substituted with OH may be chosen from compounds (III) such as 2-phenylphenol, 3-phenylphenol, 4-phenylphenol, 2-(3-hydroxyphenyl)phenol, 2-(2-hydroxyphenyl)phenol and the like such that at least two sites are available for electrophilic attack. Also, compound IV may be [1,1'-biphenyl]-4,4-diol, 3,3',5,5'-tetrakis(methoxymethyl) or [1,1'-biphenyl]-4,4-diol, 3,3',5,5'-tetrakis(ethoxymethyl) while compound V may be 1,1'-biphenyl]-4,4-diol, 3,3',5,5'-tetrakis(hydroxymethyl).

As another example, the monomer (II) may be divinylbenzene; the compound (I) may be a polycyclic aromatic such as pyrene, anthracene or naphthalene, the compound (III) may be 2-phenylphenol; and, the compound (VI) may be naphthalene, anthracene or pyrene. Also, as before the compound IV may be [1,1'-biphenyl]-4,4-diol, 3,3',5,5'-tetrakis(methoxymethyl) or [1,1'-biphenyl]-4,4-diol, 3,3',5,5'-tetrakis(ethoxymethyl) while compound V may be 1,1'-biphenyl]-4,4-diol, 3,3',5,5'-tetrakis(hydroxymethyl).

The fused aromatic moiety, Ar', in the optional repeat unit F comprises fused aromatic rings, which are substituted or unsubstituted, but different from unit A. The fused aromatic rings of the polymer can comprise 2 to 8 membered aromatic rings. Examples of the fused aromatic moiety are the following structures 10-21.

(10)

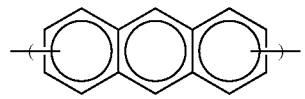
(11)

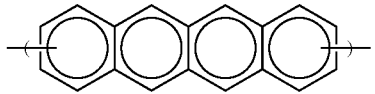
(12)

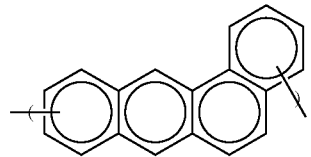
(13)

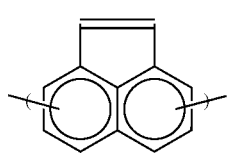
(14)

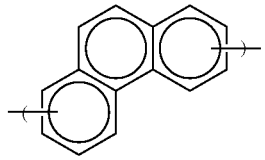
(15)

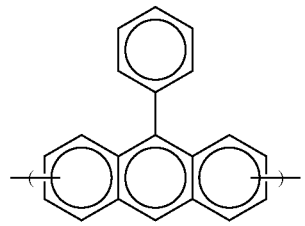
(16)

(17)
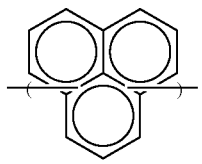

(18)
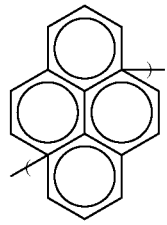

(19)
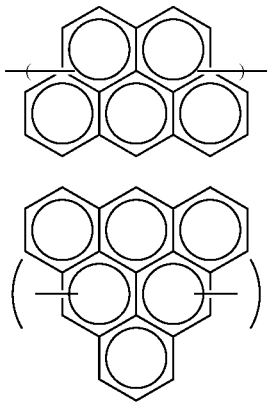

(20)
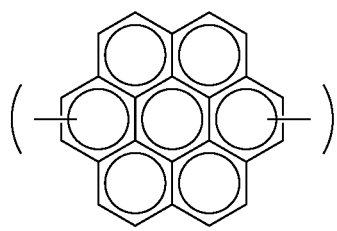

(21)

Although the unit may be as shown in structures 10-21, the fused rings may form the backbone of the polymer at any site in the aromatic structure and the attachment sites may vary within the polymer as previously described. The fused ring structure can have more than 2 points of attachment forming a branched oligomer or branched polymer. The fused aromatic rings of the polymer comprising unit comprising F may be substituted with either D" or E, where D" is independently a substituent chosen from the group consisting of hydrogen, hydroxyl or a $C_1$-$C_4$ alkyl, substituted alkyl, aryl, substituted aryl, alkylaryl, and haloalkyls, amino, aminoalkyl, alkoxy, such as methyl, aminomethyl or bromomethyl. The substituent D" on the aromatic rings may aid in the solubility of the polymer in the coating solvent. Some of the substituent D" on the fused aromatic structure may also be thermolysed during curing, such that they may not remain in the cured coating and thus give a high carbon content film useful during the etching process. The substituent E" is independently hydrogen or a substituent containing a crosslinking group of structure (4), where at least one of the pendant crosslinking groups having structure (4) is present on either repeat A, C, or on the optional repeat unit F.

The polymer may comprise more than one type of the fused aromatic structures described herein. In one embodiment the fused aromatic moiety is unsubstituted. In one embodiment the fused aromatic moiety is free of hydroxy or alkoxy groups. In another embodiment the fused aromatic moiety of A and the phenyl group of B is unsubstituted, that is substituted only with hydrogen. In another embodiment A is anthracenemethylene, B is methylenebenzenemethylene and C is hydroxybiphenyl; F when present is naphthalene or anthracene, where at least one of the pendant crosslinking groups having structure (4) is present on either repeat unit comprising A, C, or on the optional repeat unit F.

The novel polymer may comprise the following units, as long as units of A, B and C are all present and that the at least one of the units A or C is substituted with a pendant group of structure (4);

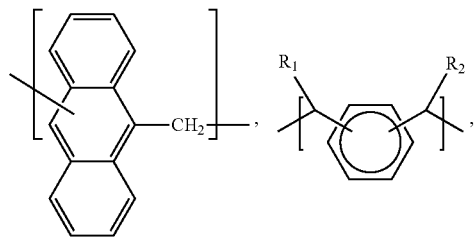

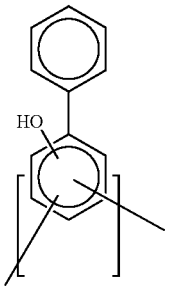

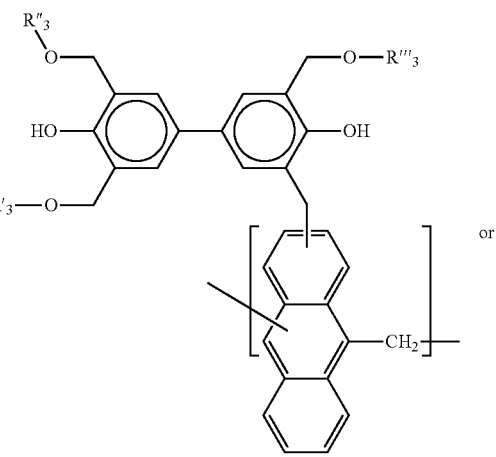

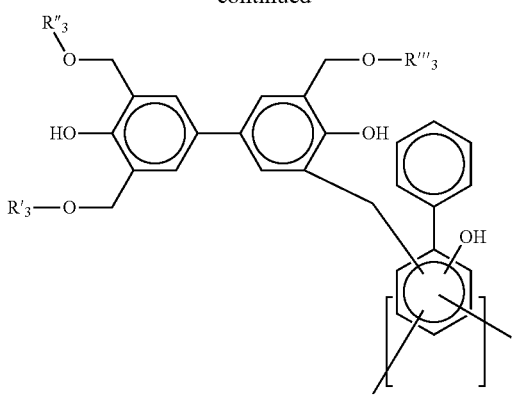

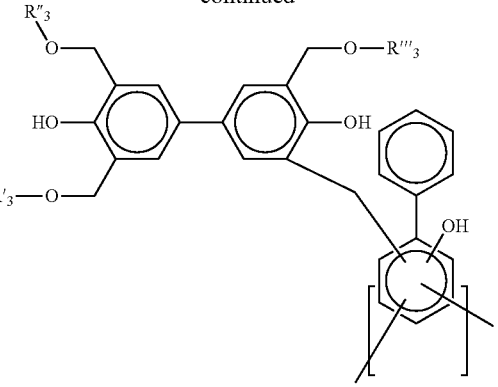

where $R_1$ is $C_1$-$C_4$ alkyl and $R_2$ is $C_1$-$C_4$ alkyl. In one embodiment $R_1$ and $R_2$ are hydrogen or methyl and $R'_3$, $R''_3$ and $R'''_3$ are independently hydrogen or a $C_1$-$C_4$ alkyl.

The novel polymer may comprise the following units, as long as unit of A, B and C are all present and that at least one of the units A or C is substituted with a pendant group structure (4):

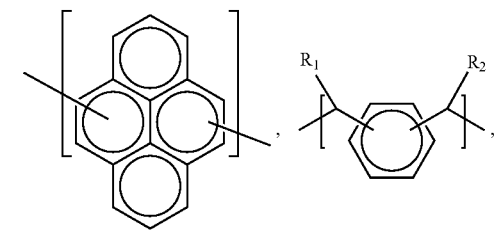

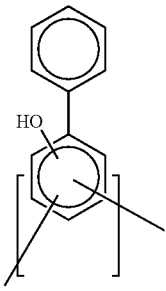

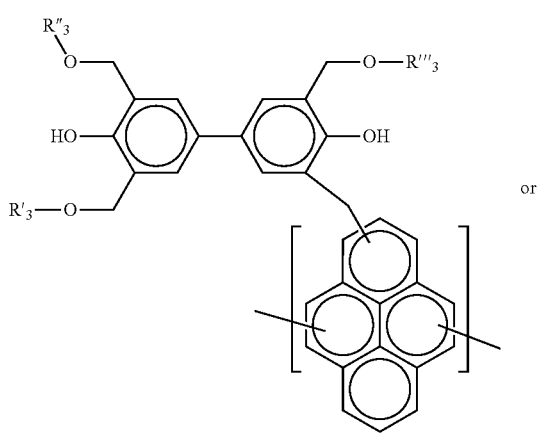

or where $R_1$ is $C_1$-$C_4$ alkyl and $R_2$ is $C_1$-$C_4$ alkyl. In one embodiment $R_1$ and $R_2$ are hydrogen or methyl and $R'_3$, $R''_3$ and $R'''_3$ are independently hydrogen or a $C_1$-$C_4$ alkyl.

In addition to other units previously described, the polymer of the novel antireflective coating comprises at least one unit, B, shown in structure (2) which comprises a phenylene group. The unit B may be derived from a monomer comprising 2 unsaturated groups, such as alkyl substituted or unsubstituted divinyl benzene or phenyl rings with two reactive methylene groups (e.g. $CH_2$—OH, $CH_2$—Cl, $CH_2$—OMe and the like) such 1,4-benzenedimethanol. Specific examples of such repeat units follow:

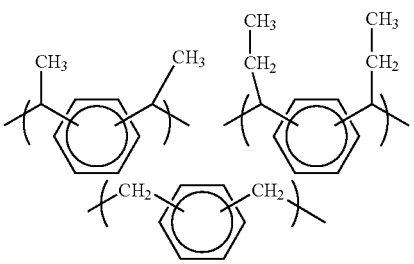

Unless otherwise defined in the text the following definition of various functional groups apply: Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like. Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy. Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

In one embodiment the novel polymer is free of any aliphatic cyclic or polycyclic groups, such as cyclohexyl, adamantyl, norbornyl, etc. In another embodiment the novel polymer is free of any aliphatic cyclic or polycyclic groups, hydroxy or alkoxy group other than the one present in unit C. In one embodiment no polymer in the composition comprises an aliphatic polycyclic group, such as cyclohexyl, adamantyl, nornornyl, etc. However, in all these embodiments at least one of the repeat units comprising A or C or the optional group comprising F is substituted with a pendant group of structure (4).

The polymer of the present novel composition may be synthesized by first making an initial polymer by reacting a) at least one aromatic compound comprising 2 or more fused aromatic rings capable of electrophilic substitution such that the fused rings form the backbone of the polymer, with b) at least one aromatic unit with two active sites which can form carbocations, and c) at least one hydroxybiphenyl compound, in the presence of an acid catalyst. The aromatic compound may be selected from monomers that provide the desired aromatic unit, more specifically structures shown above or equivalents. Additional fused aromatic monomers may be added to the reactions mixture and may be selected from compounds such as anthracene, phenanthrene, pyrene, fluoranthene, coronene triphenylene, etc. The fused aromatic rings provide at least 2 reactive sites which are sites for electrophilic substitution. This first polymer is then reacted with a monomer to provide the repeating unit F to form the polymer of this invention in which at least one of the repeat units comprising A or C or the optional group comprising F is substituted with a pendant group of structure (4). Examples of the monomer are either a [1,1'-biphenyl]-4,4-diol, 3,3',5,5'-tetrakis(alkoxymethyl) (IV) or [1,1'-biphenyl]-4,4-diol, 3,3',5,5'-tetrakis(hydroxymethyl) (V) compound Alternatively, the initial polymer, as described above, may be isolated, by precipitation into an appropriate solvent and then redissolved into an appropriate solvent and then reacted with a monomer to provide the repeating unit F to form the polymer of this invention in which at least one of the repeat units A or C or the optional group F is substituted with a pendant group of structure (4). Examples of the monomer are either a [1,1'-biphenyl]-4,4-diol, 3,3',5,5'-tetrakis(alkoxymethyl) (IV) or [1,1'-biphenyl]-4,4-diol, 3,3',5,5'-tetrakis(hydroxymethyl) (V) compound.

The monomer used to form unit B in the novel polymer comprises a phenylene unit with two reactive sites which are capable of forming carbocations in the presence of an acid, and may be selected from compounds such as divinyl benzene or benzenedimethanol. The reaction is catalysed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong normucleophilic acids.

The reaction may be carried out with or without a solvent. If a solvent is used then any solvent capable of dissolving the solid components may be used, especially one which is non-reactive towards strong acids; solvents such as chloroform, bis(2-methoxyethyl ether), nitrobenzene, methylene chloride, and triglyme, di(ethyleneglycol)dimethylether, di(propyleneglycol)dimethylether, di(propyleneglycol)diethyl ether, propylene glycol monomethy ether acetate (PGMEA), propylene glycol monomethyl ether (PGME) may be used. The reaction may be mixed for a suitable length of time at a suitable temperature, till the polymer is formed. The reaction time may range from about 3 hours to about 24 hours, and the reaction temperature may range from about 80° C. to about 180° C. Without isolating this initial polymer, after cooling the reaction mixture to 30° C. to 25° C. 10%-20% of either a [1,1'-biphenyl]-4,4-diol, 3,3',5,5'-tetrakis(alkoxymethyl) (IV) or [1,1'-biphenyl]-4,4-diol, 3,3',5,5'-tetrakis(hydroxymethyl) (V) compound is added either as a neat material in an appropriate ether solvent such as cyclopentyl methyl ether and reacted for 2 to 4 hours to form on the polymer pendant groups having structure (4). The final polymer is isolated and purified in appropriate solvents, such as methanol, hexane, heptane through precipitation and washing. The novel polymer may be fractionated to obtain a fraction with the desired molecular weight. The polymer is dissolved in a solvent, for example tetrahydrofuran (THF); a nonsolvent is added to the solution such as an alkane; and a precipitate is formed and filtered. The process of fractionation may be carried out at room temperature. The polymer may be further purified. Typically the low molecular weight portion is removed. Previously known techniques of reacting, isolating and purifying the polymer may be used. The weight average molecular weight of this initial polymer can range from about 1200 to about 5,000, or about 1300 to about 3,000 or about 1,500 to about 2,600. In this final polymer, units comprising A or C or the optional group comprising F is substituted with a pendant group of structure (4).

In the novel polymer the repeat unit A derived from a fused aromatic ring can be between 25 and 40 mole %, repeat unit B can be between 37.5 and 30 mole % and repeat unit C can be between 37.5 and 30 mole %. In another embodiment repeat unit A containing a fused aromatic ring can be between 30-35 mole %, repeat unit B can be between 32.5-35 mole %, and repeat unit C can be between 32.5-35 mole % of the total amount of repeat units.

The polymer of the present novel composition may have the structural unit as shown in structure (22), where $R_1$, $R_2$ and $R'_3$, $R''_3$ and $R'''_3$ are as previously described. In such a polymer the total amount of the repeat unit A (and optional F not shown in structure (22) derived from a fused aromatic ring be between 25 and 40 mole % of this total, optional monomer F can comprise up to 15% of the total amount. Of the remaining units repeat unit B may be between 37.5 and 30 mole % and repeat unit C may be between 37.6 and 30 mole % of the total amount of repeat units. More preferably repeat unit B and C may be between 30-35 mole % of this total. An example is (22)

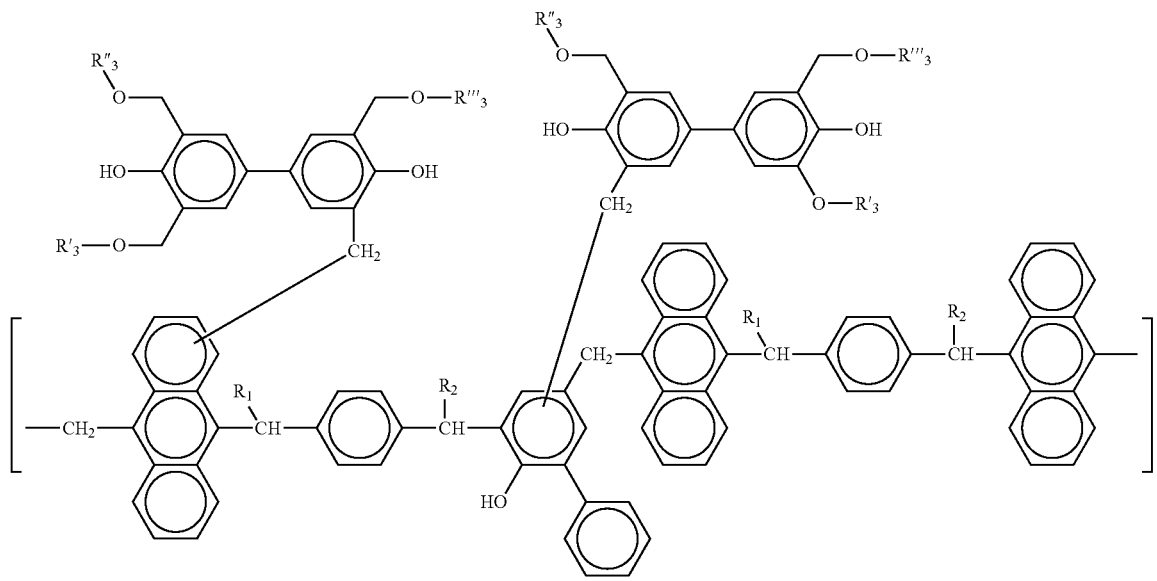

The refractive indices of the polymer of this invention, n (refractive index) and the extinction coefficient (k) (part of the complex refractive index $n_c$=n-jk) can range from about 1.3 to about 2.0 for the refractive index and about 0.04 to about 1.0 for the extinction coefficient at the exposure wavelength used, such as 193 nm, where these parameters are obtainable from an ellipsometer. The carbon content of the polymer or the composition is determined by elemental analysis of the solid composition. The carbon content of the composition or polymer can be measured after forming a coating on a substrate and drying the film. The novel polymer of the present invention retains a high carbon content even after a 400° C. bake, that is the carbon content of the polymer or composition after crosslinking is greater than 80 weight % as measured by elemental analysis, or greater than 85 weight %, or greater than weight 90%. Performing an elemental analysis on the solid coating or dry polymer provides the carbon content as weight %. The carbon content of the polymer or composition after crosslinking is greater than 80 weight % as measured by elemental analysis, or greater than 85 weight %, or greater than weight 90%. In one embodiment the carbon content of the polymer after crosslinking is in the range 80-95 weight %.

The novel composition comprising the polymer may also comprise an acid generator. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain at least one of the known photoacid generators, examples of which without limitation, are onium salts, sultanate compounds, nitrobenzyl esters, triazines, etc. The preferred photoacid generators are onium salts and sulfonate esters of hydroxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The antireflection coating composition of the present invention may contain 70 weight % to about 99 weight % of the novel fused aromatic polymer, and preferably 80 weight % to about 95 weight %, of total solids in the composition. The optional crosslinker, when used in the composition, may be present at about 1 weight % to about 30 weight % of total solids. The thermal acid generator, may be incorporated in a range from about 0.1 to about 10 weight % A) by total solids of the antireflective coating composition, preferably from 0.3 to 5 weight % by solids, and more preferably 0.5 to 2.5 weight % by solids.

The novel composition may further comprise a second polymer. The second polymer can be one which also has carbon content greater than 75 weight %, or greater than 80 weight %. The second polymer may comprise a unit containing a fused aromatic ring, A, as described herein, a phenyl moiety, B, and a third unit selected from a substituted fused aromatic ring with greater than 2 aromatic rings. The third unit may be selected from a fused aromatic substituted with a hydroxy group. The third unit may be selected from hydroxyanthracyl moiety, hydroxyphenyl moiety, hydroxynaphthyl moiety, hydroxy pyrenyl moiety, $C_1$-$C_4$alkoxy anthracyl moiety, $C_1$-$C_4$ alkyl phenyl moiety, $C_1$-$C_4$ alkyl naphthyl moiety, $C_1$-$C_4$ alkyl pyrenyl moiety, etc. The third unit may be selected from hydroxyphenyl, hydroxynaphthyl, hydroxyphenanthryl, hydroxyanthracyl, etc. The third unit may be hydroxynaphthyl group. The second polymer may be added to the composition ranging from 1 weight % to 20% by weight of the total polymer concentration in the composition, or 1% to 10% by weight of the total polymer concentration. In one embodiment the second polymer is free of any aliphatic cyclic polycyclic groups. In another embodiment the second polymer is free of any aliphatic cyclic polycyclic groups and the third unit is a hydroxynaphthyl group.

In one embodiment the novel composition comprises the novel polymer, a second polymer described herein, a thermal acid generator, optional surfactant and solvent(s). Another embodiment of the novel composition comprises the novel polymer, a thermal acid generator, optional surfactant and solvent(s).

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition may comprise other components to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The extinction coefficient (k) (part of the complex refractive index $n_c$=n-jk) of the novel coating composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values for the polymer or the composition can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.75, and for 248 nm the preferred range for k is about 0.15 to about 0.8.

The carbon content of the novel antireflective coating composition is greater than 80 weight % or greater than 85 weight % as measured by elemental analysis of the dried film made from the composition. The carbon content of the film derived from the composition is maintained at a level of 80 weight % or greater than 80 weight % even after the film from the novel composition has been heated to temperatures up to 400° C. for up to 120 seconds.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating can be spin coatable or chemical vapor deposited. In one embodiment the substrate is coated with a first film of the novel composition of the present invention and a second coating of another antireflective coating comprising silicon is coated above the first film. The second coating can have an extinction coefficient (k) value in the range of about 0.05 and 0.5. A film of photoresist is then coated over the second coating. The imaging process is exemplified in FIG. 1.

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process, such as about 240 nm to about 12 nm.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers-fonium salts, such as those described in U.S. Pat. No. 4,491, 628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866, 984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587 and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed with a mask. The exposure may be done using typical exposure equipment. Examples of exposure wavelength sources are 248 nm and 193 nm, although any source may be used. The exposed photoresist is then developed in an aqueous developer to remove the treated photoresist. The developer is preferably an aqueous alkaline solution comprising, for example, tetramethyl ammonium hydroxide (TMAH). Example of a developer is 0.26N aqueous tetramethyl ammonium hydroxide (TMAH) solution. The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the extinction coefficient (k) (part of the complex refractive index $n_c$=n-jk) values of the carbon hard mask antireflective coating in the Examples below were measured on a J. A. Woollam VASE32 ellipsometer.

The molecular weight of the polymers was measured on a Gel Permeation Chromatograph.

Synthesis Example 1

The reaction was done in a 250 ml, 4 neck round bottomed flask equipped with overhead mechanical stirring, condenser, thermo watch, dean stark trap and under an atmosphere of nitrogen. The Pyrene (17.96 g, 0.0444 mol), 2-phenylphenol (7.56 g, 0.0444 mol), Divinylbenzene (6.18 g, 0.0444 mol) were dissolved in 100.16 g of Diglyme and 20.46 g of cyclopentyl methyl ether (CPME) and mixed together under a nitrogen atmosphere for 10 min. To this stirred mixture, was then added triflic acid (0.951 g, ~3 mole % of total monomers) which was mixed into the solution for 5 minutes followed by raising the temperature of the stirred reaction mixture to 145° C. and stirred for 3 hours. The heat was then turned off and the reaction mixture allowed to cool to 50° C. Then 1,1'-biphenyl]-4,4-diol, 3,3',5,5'-tetrakis(methoxymethyl) (T-MOM) (3.1 g, 10 mole % of total monomers) (10% of monomers) dissolved in 50 ml of CPME was added to the reaction mixture and stirred for an additional 3 hours. After this time, the reaction mixture was washed three times with de-ionized water is a separatory funnel, keeping the organic layer. The washed organic layer was precipitated into 1000 ml hexane, filtered, washed and then dried under vacuum at 60° C. overnight. The dried polymer was dissolved in 158 ml THF and precipitated into 1000 mL of hexane. The precipitate was filtered, washed and dried overnight under vacuum at 60° C. This re-isolation step was repeated twice to give 18.00 g gram of polymer (57% yield) which has the partial structure shown below. GPC: Mw is 3523, and (polydispersity)Pd 1.88.

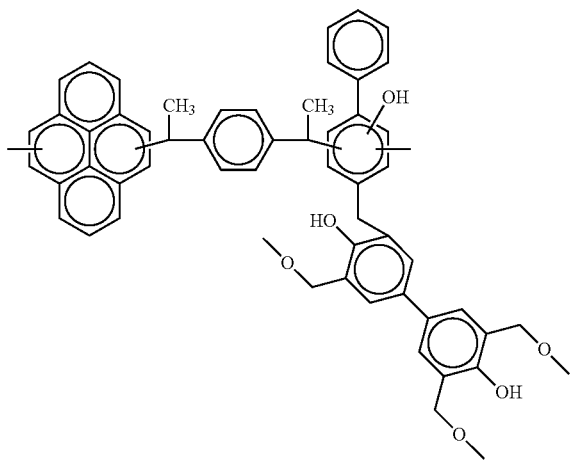

Processing Example 1

The polymer of Synthesis Example 1 was dissolved in PGMEA/Cyclohexanone (90/10 volume) as a 7% wt solution. This solution was filtered through a 0.2 μm PTFE filter and the solution was applied to silicon wafer and spun at 1,500 rpm to form a 200 nm thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. After PAB (230°), the coatings passed soak tests with PGMEA, ethyl Lactate and cyclohexanone solvent showing no visible sign of any film thickness loss. After PAB processing at different temperatures the polymer showed the following elemental composition.

|     | 230° bake | 400° bake |
| --- | --- | --- |
| % C | 90.23 | 79.02 |
| % H | 5.37  | 2.74  |

With a PAB of 250° C. this polymer coating gave n=1.4731 and k=0.6477.

Synthesis Example 2

The reaction was done in a 500 ml, 4 neck round bottomed flask equipped with overhead mechanical stirring, condenser, thermo watch, dean stark trap and under an atmosphere of nitrogen. The 9-Anthracene methanol (20.8 g, 0.10 mole), 2-Phenylphenol (17 g, 0.10 mole), Divinyl benzene (13 g, 0.1 mole) were dissolved in 160 g of diglyme and 45 g of CPME and mixed together under a nitrogen atmosphere for 10 min. To this stirred mixture, was then added triflic acid (1.5, ~3 mole % of total monomers) which was mixed into the solution for 10 minutes followed by raising the temperature of the stirred reaction mixture to 140° C. and stirred at this temperature for 3 hours.

After the reaction mixture cooled to 50° C., then T-MOM (7.6 g, 10 mole % of total monomers) dissolved in 50 ml of cyclopentyl methyl ether (CPME) was added to the reaction mixture and it was stirred for an additional 3 hours. After this time, the reaction mixture was washed two times with de-ionized water (2×200 mL) in a separatory funnel, keeping the organic layer. The washed organic layer was precipitated into 2500 ml hexane, filtered, washed and then dried under vacuum at 60° C. overnight. The dried polymer was dissolved in 150 mL THF and precipitated into 2000 mL of hexane. The precipitate was filtered, washed and dried overnight under vacuum at 60° C. This re-isolation step was repeated once again to give a 43% yield of a polymer soluble in PGMEA which has the partial structure shown below.

GPC: Mw is 3769, and Pd 1.73

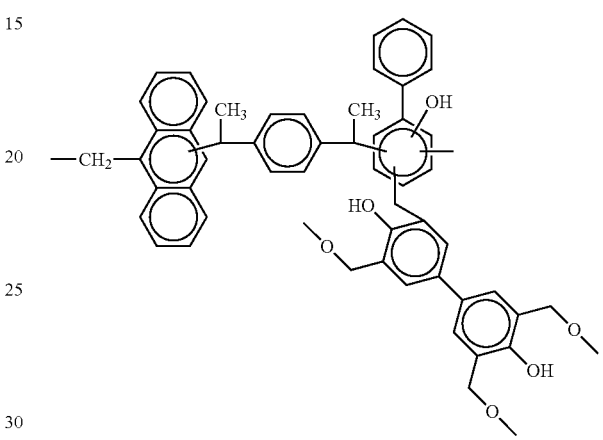

Processing Example 2

The polymer of Synthesis Example 2 was dissolved in PGMEA as a 7% wt solution. This solution was filtered through a 0.2 μm PTFE filter and the solution was applied to silicon wafer and spun at 1,500 rpm to form a 200 nm thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. After PAB (230), the coatings passed soak tests with PGMEA, ethyl lactate and cyclohexanone solvent showing no visible sign of any film thickness loss. After PAB processing at different temperatures the polymer showed the following elemental composition.

|     | 230° bake | 400° bake |
| --- | --- | --- |
| % C | 87.88 | 80.90 |
| % H | 5.79  | 3.35  |

With a PAB of 250° C. this polymer coating gave n=1.47 and k=0.60

Synthesis Example 3

The reaction was done in a 5 L, 4 neck round bottomed flask equipped with overhead mechanical stirring, condenser, thermo watch, dean stark trap and under an atmosphere of nitrogen. The 9-Anthracene methanol (208.26 g, 1.0 mole), 2-Phenylphenol (170.21 g, 1.0 mole), Divinyl benzene (130.19 g, 1 mole) were dissolved in 1525 g of diglyme and 430 g of CPME and mixed together under a nitrogen atmosphere for 10 min. To this stirred mixture, was then added triflic acid (15.2 g, ~3 mole % of total monomers) which was mixed into the solution for 10 minutes followed by raising the temperature of the stirred reaction mixture to 140° C. and stirred for 3 hours. The heat was then turned off and the reaction mixture allowed to cool to 50° C. Then 1500 mL of CPME was added, along with T-MOM (76.2 g, 10 mole % of total monomers), to the reaction mixture and it was stirred for an additional 3 hours. After this time, the reaction mixture was washed two times with de-ionized water (2×1000 mL) in a 5 L separatory funnel, keeping the organic layer. The washed organic layer was precipitated into 7.5 L of hexane, filtered, washed and then dried under vacuum at 60° C. overnight. The dried polymer was dissolved in 1200 mL THF and precipitated into 7 L of hexane. The precipitate was filtered, washed and dried overnight under vacuum at 60° C. This gave a 84% yield of a polymer soluble in PGMEA which has the partial structure shown below.

GPC: Mw is 4336, and Pd 2.37.

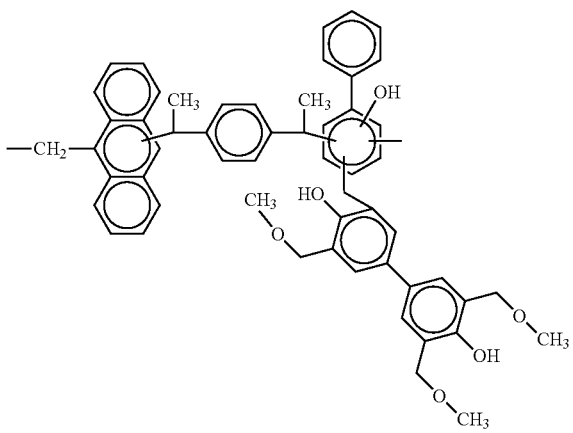

Processing Example 3

The polymer of Synthetic Example 3 was dissolved in PGMEA as a 7% wt solution. This solution was filtered through a 0.2 μm PTFE filter and the solution was spun onto a silicon wafer at 1,500 rpm to form a 200 nm thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. After PAB (230° C.), the coatings passed soak tests with PGMEA, ethyl lactate and cyclohexanone solvent showing no visible sign of any film thickness loss. After PAB processing at different temperatures the polymer showed the following elemental composition.

|  | 230° bake | 400° bake |
| --- | --- | --- |
| % C | 87.80 | 80.90 |
| % H | 5.29 | 3.15 |

With a PAB of 250° C. this polymer coating gave n=1.47 and k=0.60

Synthesis Example 4

The reaction was done in a 5 L, 4 neck round bottomed flask equipped with overhead mechanical stirring, condenser, thermo watch, dean stark trap, bottom outlet valve (BOV) and under an atmosphere of nitrogen. The 9-Anthracene methanol (1 Kg, 4.80 mole), 2-Phenylphenol (0.82, 1.0 mole), Divinyl benzene (0.63 Kg, 4.83 mole) were dissolved in 1.5 Kg of diglyme and 0.55 Kg of CPME and mixed together under a nitrogen atmosphere for 10 min. To this stirred mixture, was then added triflic acid (25 g, —3 mole % of total monomers) which was mixed into the solution for 10 minutes followed by raising the temperature of the stirred reaction mixture to 135° C. and stirred for 1.25 hours. When the reaction mixture was cooled to below 60° C., the reaction mixture was transferred to a 20 L reactor using the BOV to which was added 3.5 kg of CPME. To the mixture in the 20 L reactor was added 4.0 Kg of DI water; this mixture was then stirred for 5 minutes, allowed to settle and the water separated. This washing procedure was repeated twice again. After the final washing, and water separation, 3.3 Kg of hexanes was added to the stirred mixture which precipitated the polymer after 2 minutes. The stirring was then stopped and the polymer was allowed to settle to the bottom. The top layer of solvent was removed and the bottom layer of polymer was dissolved by adding 2.2 Kg of THF with stirring. After dissolution, the polymer was precipitated again by adding 3 Kg of hexanes while stirring. After stirring for 2 minutes the polymer was allowed to settle to the bottom and the top layer of solvent was removed. The polymer layer was then dissolved in 1.75 Kg of THF while stirring. After dissolution, 2.8 Kg of hexanes while stirring was added to precipitate the polymer. After 2 minutes of stirring the polymer was allowed to settle to the bottom and the top layer of organic solvent was removed. The polymer layer was then dissolved in 1.5 Kg of THF while stirring. After dissolution, 2.5 Kg of hexanes while stirring was added to precipitate the polymer. After 2 minutes of stirring the polymer was allowed to settle to the bottom and the top layer of organic solvent was removed. The polymer layer was then dissolved in 1.25 Kg of THF while stirring. After dissolution, the polymer solution was filtered with filter paper and transferred to a 4-L container containing 0.125 wet Ecodex (Daychem) for metal reduction and this mixture stirred overnight to reduce metals. The Ecodex was then filtered with and the solution and filtered again with a 0.04 micron filter. The filtered solution was then precipitated in 5.0 gallons of DI water, the precipitate filtered, and dried in a vacuum oven a 80° C. The dried polymer recovered amounted to 0.5 Kg which has the partial structure shown below.

GPC: Mw is 2000, and Pd 1.4.

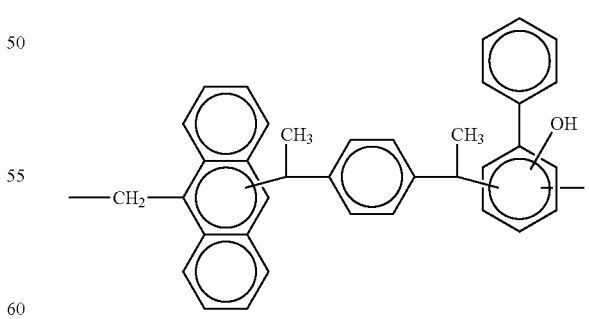

Synthesis Example 5

The reaction was done in a 500 ml, 4 neck round bottomed flask equipped with overhead mechanical stirring, condenser, thermo watch, dean stark trap and under an atmosphere of nitrogen. The polymer of Synthesis Example 4 (25 g) was dissolved in 500 ml of PGMEA along with [1,1'-biphenyl]-4,4-diol, 3,3',5,5'-tetrakis(methoxymethyl) (T-MOM) (3.125 g, 12.5 mole % of repeat units). This solution was stirred under nitrogen for 15 minutes. After this time, the temperature was raised to 50° C. and held there for 3 hours. Then, the reaction was cooled to room temperature and 5 g wet Ecodex (Heraus-Deychem) was added to neutralize the acid. This mixture was stirred for 2 hours at room temperature and then filtered with filter paper to remove the Ecodex. The filtered solution was filtered again using a 0.2 PTFE micron. The polymer has the partial structure shown below.

12.5 mole % of repeat units). Triflic acid (0.125 g) was added and the solution was stirred under nitrogen for 15 minutes. The temperature was raised to 50° C. and held there for 3 hours. Then, the reaction was cooled to room temperature and 5 g wet Ecodex (Heraus-Daychem) was added to neutralize the acid. This mixture was stirred for 2 hours at room temperature and then filtered with filter paper to remove the Ecodex. The filtered solution was filtered again using a 0.2 PTFE micron. The polymer has the partial structure shown below GPC: Mw is 6587, and Pd 2.10

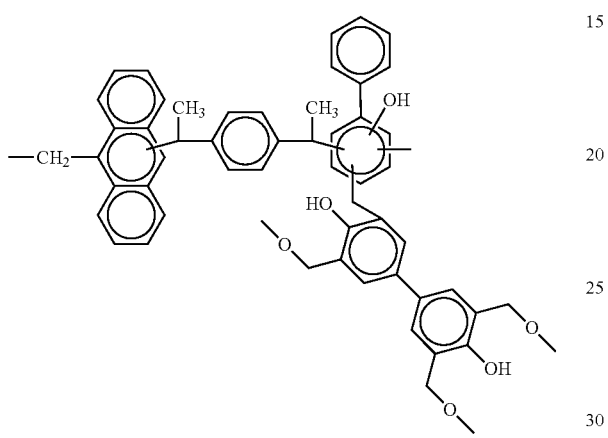

GPC: Mw is 3767, and Pd 1.77

Processing Example 4

The concentration of the polymer solution of Synthesis Example 5 was adjusted with PGMEA to a 7% wt solution. This solution was filtered through a 0.2 μm PTFE filter and the solution was spun onto a silicon wafer at 1,500 rpm to form a 200 nm micron thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. After PAB (230° or 400° C.), the coatings passed soak tests with PGMEA, ethyl lactate and cyclohexanone solvent showing no visible sign of any film thickness loss. After PAB processing at different temperatures the polymer showed the following elemental composition.

|     | 230° bake | 400° bake |
| --- | --- | --- |
| % C | 89.64 | 80.88 |
| % H | 5.92 | 3.72 |

With a PAB of 250° C. this polymer coating gave n=1.47 and k=0.68

Synthesis Example 6

The reaction was done in a 500 ml, 4 neck round bottomed flask equipped with overhead mechanical stirring, condenser, thermo watch, dean stark trap and under an atmosphere of nitrogen. The polymer of synthesis example 4 (25 g) was dissolved in 500 mL of PGMEA along with T-MOM (3.125 g,

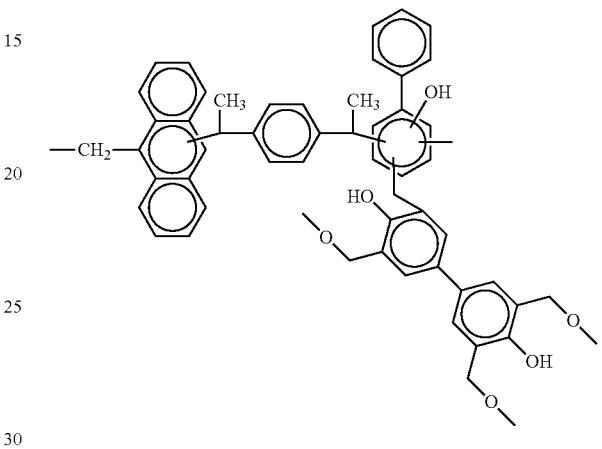

Processing Example 5

The concentration of the polymer solution of Synthesis Example 6 was adjusted with PGMEA so that after filtered through a 0.2 μm PTFE filter and the solution was spun onto a silicon wafer at 1,500 rpm it formed a 81.5 nm thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. After PAB 270° C. for 60 sec, the coatings passed soak tests with PGMEA, ethyl lactate and cyclohexanone solvent showing no visible sign of any film thickness loss. After PAB processing at different temperatures the polymer showed the following elemental composition.

|     | 270° bake |
| --- | --- |
| % C | 88.74 |
| % H | 5.82 |

With a PAB of 250° C. this polymer coating gave n=1.48 and k=0.63

Three additional batches were made of this material including one which was scaled up tenfold. All polymers had similar properties as described above in synthetic examples 3 and processing example 3. Having very good solubility in PGMEA, this polymer showed no tendency to form precipitates in the spin bowl.

Synthesis Example 7

The synthesis example #1 was repeated and 58% yield of the polymer was obtained, with GPC Mw 3583, and Pd=2.07.

Processing Example 6

The polymer from synthesis example 7 and dodecylbenzenesulfonic acid (DBSA) (Aldrich) were dissolved in an 80/20 by weight mixture of PGMEA and Cyclohexanone to form a solution containing respectively 7 wt % polymer and 10 wt % of solids DBSA and filtered through 0.2 μm filter.

Synthesis Example 8

The reaction was done in a 1 L, 4 neck round bottomed flask equipped with overhead mechanical stirring, condenser, thermo watch, dean stark trap, bottom outlet valve (BOV) and under an atmosphere of nitrogen. The Pyrene (101.1 g, 0.5 mole), 2-Phenylphenol (42.55 g, 0.25 mole), Divinyl benzene (32.5 g, 0.25 mole) were dissolved in 410 g of diglyme and 115 g of CPME and mixed together under a nitrogen atmosphere for 10 min. To this stirred mixture, was then added triflic acid (5.3 g, ~3 mole % of total monomers) which was mixed into the solution for 5 minutes followed by raising the temperature of the stirred reaction mixture to 145° C. and stirred for 3 hours. When the reaction mixture was cooled to below 50° C., the reaction mixture was transferred to separatory funnel and washed three times with DI water. After the final washing, and water separation, the organic phase was precipitated into 4000 mL of hexanes, filtered, washed with additional hexane and dried under vacuum at 60° C. overnight. The dried polymer was dissolved in 500 mL THF and precipitated into 4000 mL of hexane, filtered, washed and dried again under vacuum at 60° C. overnight. This isolation procedure was repeated one more. This resulted in a 32% yield of polymer.

GPC: Mw is 1801, and Pd 1.41.

Elemental analysis after heating at 230° C./60 sec C was 90.73%, H was 5.73%.

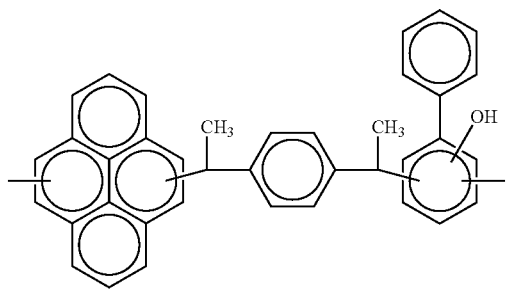

Synthesis Example 9

The reaction was done in a 500 ml, 4 neck round bottomed flask equipped with overhead mechanical stirring, condenser, thermo watch, dean stark trap and under an atmosphere of nitrogen. The polymer of synthesis example 8 (12.5 g) was dissolved in 112.5 g of PGMEA and 12.5 g of cyclohexanone. This solution was stirred at room temperature for 5 minutes, and T-MOM (1.25 g, 10 mole % of repeat units) and stirred under nitrogen for 15 minutes. Triflic acid (0.0625 g, 0.5%) was then added and the temperature was raised to 50° C. and held there for 6 hours. Then, the reaction was cooled to room temperature and 2.5 g wet Ecodex (Heraus-Daychem) was added to neutralize the acid. This mixture was stirred for 2 hours at room temperature and then filtered with filter paper to remove the Ecodex. The filtered solution was filtered again using a 0.2 μm PTFE micron. The polymer has the partial structure shown below.

GPC Mw 1901, Pd 1.49

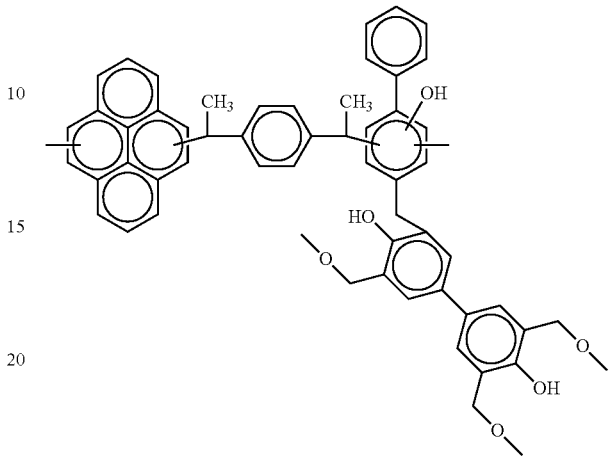

Processing Example 7

The concentration of the polymer solution of Synthesis Example 9 was adjusted with PGMEA so that after filteration through a 0.2 μM PTFE filter and spincoating onto a silicon wafer at 1,500 rpm it formed a 200 nm thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. After PAB 240° for 60 sec, the coatings passed soak tests with PGMEA, ethyl lactate and cyclohexanone solvent showing no visible sign of any film thickness loss.

Synthesis Example 10

Synthesis Example 5 was repeated and a similar polymer was obtained with GPC Mw 4613, and Pd 1.95.

Processing Example 8

Two 4" quartz wafers had their absorbance characterized from 185 to 800 nm using a UV spectrometer. These were labelled blank 1 and blank 2.

The polymer from synthesis example 10 was dissolved in PGMEA (10 wt %) and coated on a 6" silicon wafers with spincaster (Model WS-400BZ-6NPP/Lite spincaster from Laurel). Then one of the blank 4" quartz wafer (blank 1) was placed in holder such that it was about 0.5 inches from the coated silicon wafer and the coated silicon wafer was placed on a hot plate (Model KW-4AH from Chemat Technology, INC at) 250° C./60 sec, while a nitrogen flow was maintained on top of the quartz wafer, condensing the out gassing vapor on the bottom of 4" quartz wafer (sample 1). This procedure to deposit out-gassing products from heated material on a silicon wafer onto the quartz wafer was repeated ten times on the same quartz disk prior to having its absorbance characterized again The same experiment was done with polymer from synthesis example 4 (sample 2) and the quartz wafer blank 2.

The absorbance of these samples was measured in the same manner as was done for the original blank samples. The difference in absorbance of the quartz wafers at 193 nm before and after deposition were representative of the amount of material deposited as shown in Table 1.

TABLE 1

Absorbance of outgassing materials at 193 nm

| Sample | Absorbance at 193 nm due to condensed outgassing |
|---|---|
| Polymer of Synthetic Example 10 | 0.1848 |
| Polymer of Synthetic Example 4 | 0.3100 |

As can be seen from Table 1, the polymer of this invention with attached crosslinking groups (Synthetic example 10) has a dramatically decreased level of outgassing compared to a similar polymer not containing the crosslinking group. Outgassing is undesirable as the materials can damage the equipment.

Processing Example 9 Via Filling

General Procedure

Using an ISA Optictrack coat/bake/chill processing system, a formulation 1-3 as described below was coated onto a 6" silicon wafer adjusting the rpm in order to achieve the target film thickness of 250 nm (Nanospec 8000 from Nanometric) after a post applied bake at 240° C. for 60 seconds.

Then silicon wafer chips into which 130 nm, 140 nm, 160 nm, 200 nm, 300 nm (1:1), (11.4) and (1:6) vias have been etched to a depth of 600 nm were glued to a bare silicon wafer and this assembly was coated with the formulation, as before, using a post applied bake of 240° C. for 60 seconds on an optitrack. After processing, the wafer chips were removed from the silicon wafer, their backsides cleaned with acetone and they were submitted for (scanning electron microscope) SEM cross sections of 130 nm, 140 nm, 160 nm, 200 nm, 300 nm (1:1), (11.4) and (1:6) vias and flat areas.

Formulation 1:(Comparative):The polymer of example 4 as a 7 wt % solution in PGMEA containing 4 wt % of solid DBSA, and 10 wt % of solid T-MOM; Formulation 2: The polymer of example 6 as a 7 wt % solution in PGMEA; Formulation 3: The polymer of example 1 as a 7 wt % solution in PGMEA/cyclohexanone (80/20 by volume).

SEM cross-section obtained for all these formulations showed that for 1:1 Vias (100 nm; 90 nm; 80 nm; 75 nm) good via filling was obtained with no visible pinholes, voids or other defects. The following less dense pitches also gave very good via filling with no visible pinholes, voids or other defects: 100 nm, 90 nm, 80 nm and 75 nm (pitch(1000 nm); pitch(250 nm); pitch (200 nm); pitch (180 nm); pitch (160 nm); pitch (150 nm)). The 6" silicon wafers coated with the formulation showed no visible pinholes, voids or other defects. It was evident that the polymer of this invention (Synthetic examples 1 and 6 had equivalent via filling capability to that of polymer not containing the attached crosslinking moiety (i.e. Synthetic example 4) while reducing dramatically the amount of out-gassing as evidenced in Table 1.

The invention claimed is:

1. An antireflective coating composition comprising a crosslinkable polymer, where the crosslinkable polymer comprises at least one unit of fused aromatic moiety, at least one unit with a phenylene moiety, and at least one hydroxybiphenyl unit, furthermore where the polymer comprises a crosslinking moiety of structure (4),

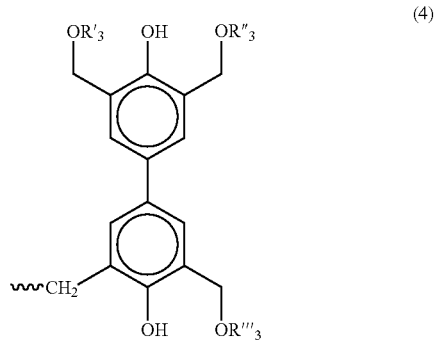

where $R'_3$, $R''_3$ and $R'''_3$ are independently hydrogen or a $C_1$-$C_4$alkyl.

2. The antireflective coating composition of claim 1, where the crosslinkable polymer comprises at least one unit 1', at least one unit 1" and at least one unit 1'''

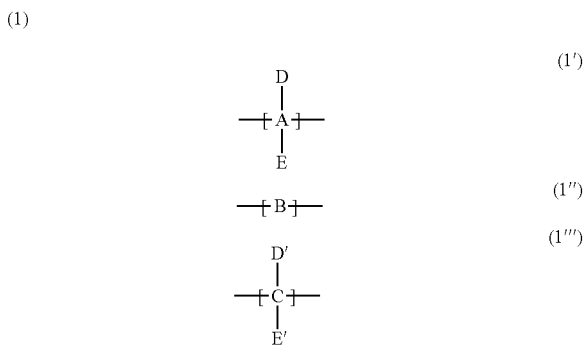

where A is a fused aromatic ring, B has a structure (2), and unit 1''' is a group of structure (3),

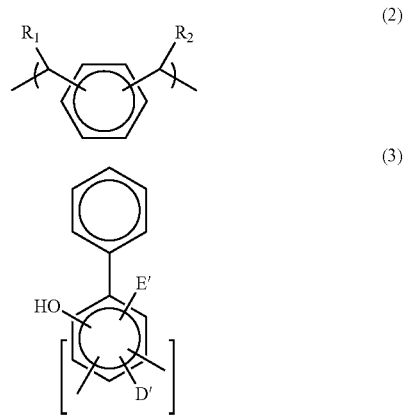

where $R_1$ is H or $C_1$-$C_4$alkyl, $R_2$ is H or $C_1$-$C_4$alkyl, D and D' are independently selected from a group consisting of hydrogen, hydroxyl and $C_1$-$C_4$alkyl, E and E' are independently hydrogen or a group of structure 4, furthermore where the polymer comprises a crosslinking moiety of structure (4),

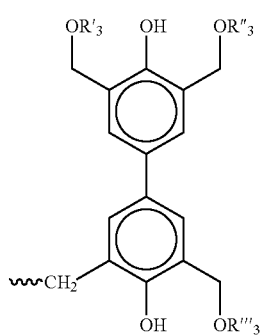

(4)

where R'$_3$, R"$_3$ and R'"$_3$ are independently hydrogen or a C$_1$-C$_4$alkyl.

3. The composition of claim 1, where the fused aromatic moiety consists of 2 to 8 fused aromatic rings.

4. The composition of claim 1, where the unit of fused aromatic moiety has structure (6) where D is independently selected from a group consisting of hydrogen, and C$_1$-C$_4$alkyl and E is independently selected from the group consisting of hydrogen or a group of structure 4

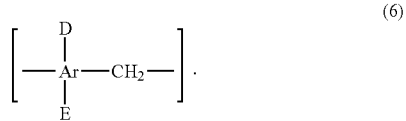

(6)

5. The composition of claim 1, where the polymer further comprises unit of structure (8), where F is a fused aromatic ring moiety, D" is chosen from the group consisting of hydrogen, hydroxyl C$_1$-C$_4$alkyl, substituted C$_1$-C$_4$alkyl, alkoxy, aryl, substituted aryl, alkylaryl, haloalkyl, amino and aminoalkyl, and E" is hydrogen or a group of structure 4,

(8)

6. The composition of claim 5, where the fused aromatic ring moiety F comprises 2-8 aromatic rings.

7. The composition of claim 1, where the fused aromatic moiety has 2 to 5 aromatic rings.

8. The composition of claim 1, where the fused aromatic moiety has 3 or 4 aromatic rings.

9. The composition of claim 1, where the composition further comprises a thermal acid generator.

10. The composition of claim 1, where the polymer has a carbon content of greater than 80 weight % by solid content.

11. The antireflective coating composition claim 1 having a carbon content of greater than 80 weight % by solid content after heating to 400° C.

12. A process for manufacturing a microelectronic device, comprising;
   a) providing a substrate with a first layer of an antireflective coating composition from claim 1;
   b) optionally, providing at least a second antireflective coating layer over the first antireflective coating composition layer;
   b) coating a photoresist layer above the antireflective coating layers;
   c) imagewise exposing to radiation the photoresist layer;
   d) developing the photoresist layer with an aqueous alkaline developing solution.

13. The process of claim 12, where the second antireflective coating comprises silicon.

14. The process of claim 13, where the photoresist is imageable with radiation from 240 nm to 12 nm.

* * * * *